(12) United States Patent
Barkan et al.

(10) Patent No.: US 9,267,984 B1
(45) Date of Patent: *Feb. 23, 2016

(54) SUB-SYMBOL RATE CABLE TESTER

(71) Applicant: Marvell World Trade Ltd., St. Michael (BB)

(72) Inventors: Ozdal Barkan, Mountan View, CA (US); William Lo, Cupertino, CA (US); Tak-Lap Tsui, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 169 days.

This patent is subject to a terminal disclaimer.

(21) Appl. No.: 14/200,707

(22) Filed: Mar. 7, 2014

Related U.S. Application Data

(63) Continuation of application No. 13/958,988, filed on Aug. 5, 2013, now Pat. No. 8,669,767, which is a continuation of application No. 12/330,751, filed on Dec. 9, 2008, now Pat. No. 8,513,952.

(60) Provisional application No. 61/007,072, filed on Dec. 11, 2007.

(51) Int. Cl.
*G01R 31/00* (2006.01)
*G01R 31/28* (2006.01)

(52) U.S. Cl.
CPC ...................................... *G01R 31/28* (2013.01)

(58) Field of Classification Search
CPC ...... G01R 31/021; G01R 31/00; H04L 43/50; H04L 12/2697
See application file for complete search history.

(56) References Cited

U.S. PATENT DOCUMENTS

| | | | |
|---|---|---|---|
| 5,481,564 A | 1/1996 | Kakuishi et al. | |
| 6,115,418 A | 9/2000 | Raghavan | |
| 6,438,163 B1 | 8/2002 | Raghavan et al. | |
| 6,590,930 B1 | 7/2003 | Greiss | |
| 2004/0013208 A1* | 1/2004 | Bui | H04L 1/24 375/316 |
| 2004/0032921 A1* | 2/2004 | Bui | H04L 25/0216 375/350 |
| 2004/0252802 A1 | 12/2004 | Yamaguchi | |
| 2005/0041727 A1 | 2/2005 | Agazi | |
| 2005/0052190 A1 | 3/2005 | McCosh | |
| 2005/0111559 A1 | 5/2005 | Mezer | |
| 2006/0007993 A1 | 1/2006 | Wang et al. | |
| 2007/0194796 A1 | 8/2007 | Harrison et al. | |
| 2009/0225900 A1 | 9/2009 | Yamaguchi et al. | |

FOREIGN PATENT DOCUMENTS

GB  2 065 312 A  6/1981

* cited by examiner

*Primary Examiner* — Tung X Nguyen
*Assistant Examiner* — Son Le

(57) ABSTRACT

Aspects of the present disclosure provide for a cable tester that tests a cable to determine the cable length. The cable tester can include a clock generator that generates a clock that has clock period that is a multiple of the data symbol period and a signal generator that injects the training signal, which can be synchronous with the clock, into the cable. The cable tester can also include a receiver that samples the returned signal from the cable and adaptively filters the returned signal based on the training signal and a controller that determines the cable length from the adaptive filter tap coefficients.

20 Claims, 4 Drawing Sheets

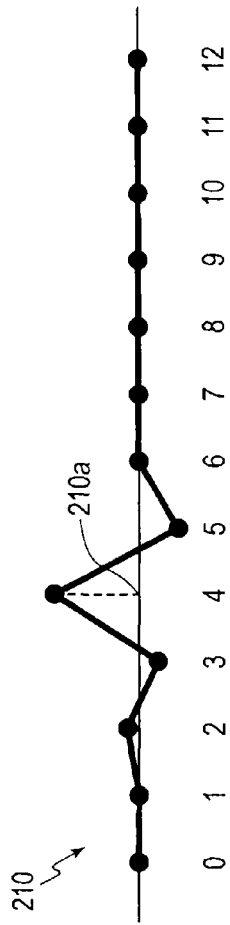
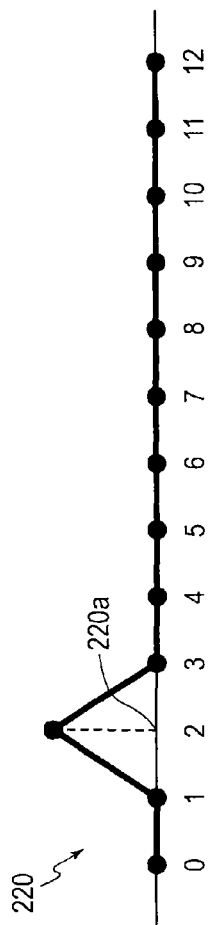
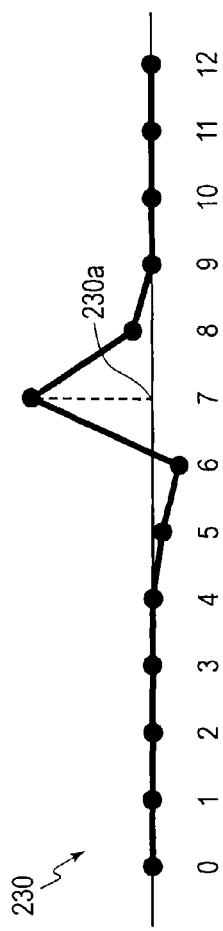
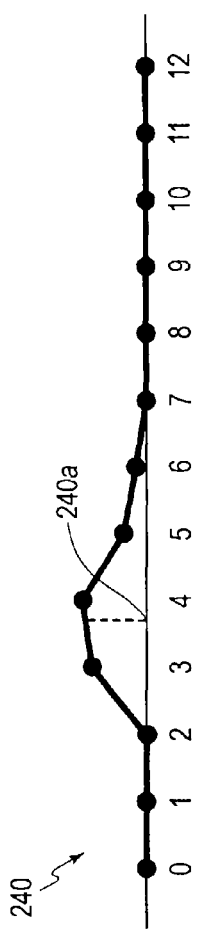
FIG. 2A
FIG. 2B
FIG. 2C
FIG. 2D

SUB-SYMBOL RATE CABLE TESTER

INCORPORATION BY REFERENCE

This application is a continuation of U.S. application Ser. No. 13/958,988, filed on Aug. 5, 2013, which is a continuation of U.S. application Ser. No. 12/330,751, now issued as U.S. Pat. No. 8,513,952, filed on Dec. 9, 2008, which claims the benefit of U.S. Provisional Application No. 61/007,072, filed on Dec. 11, 2007. The disclosures of the applications referenced above are incorporated herein by reference in their entireties.

BACKGROUND

A cable tester (CT) can test the cable length, cable bandwidth, and other characteristics of a cable or transmission line that conducts a signal from a physical layer device (PHY) to a remote terminal or termination. The CT may be located in or near the PHY. The cable length can vary from zero to several hundred meters or more.

The cable can attenuate the AC and DC components of the signal, distort the signal, and introduce other impairments, such as impairments that are a function of cable length. For example, the cable can attenuate a DC component that powers the remote terminal. The AC components of the signal may be subject to distortion, such as dispersion and inter-symbol interference (ISI), cross-talk from nearby conductors in the cable, and other impairments.

The cable may be a multi-conductor cable, such as a CAT 5 or CAT 5e cable that includes multiple unshielded twisted pairs, a parallel data cable or ribbon cable, a single conductor pair, such as a coaxial cable a single twisted pair, and the like. Both types of cable can carry an injected signal or source waveform from a PHY to a remote terminal and a reflected signal back to the PHY. A multi-conductor cable can carry multiple signals, such as the signal from the PHY to the remote terminal and other signals on other conductors, such as a loop-back signal from the remote signal back to the PHY.

The generator impedance of the PHY or the termination impedance of the remote terminal may be mismatched to the cable impedance. An impedance-mismatched generator or termination can reflect a portion of the injected signal back to the PHY. For example, an imperfectly impedance matched termination can cause a far-end reflection that returns an echo to the signal source or generator in the PHY after a round-trip propagation delay. When the velocity of the injected signal on the cable is known, then the distance between the PHY and the remote terminal can be determined by measuring the round-trip propagation delay by the signal group velocity.

The time domain reflectometry (TDR) method is a radar-like method that can determine the length of the cable between a PHY and a remote terminal. In the TDR method, the CT can generate a pulse with fast rise and fall times compared to a data symbol clock period then measure the reflected signal from the cable. The reflections may be near-end reflections, intermediate-distance reflections, or far-end reflections from impedance discontinuities, such as opens or shorts, at corresponding distances from the CT to the remote terminal or cable termination. The TDR method can work well, up to about 400 meters, when the impedance mismatch of the remote terminal to the cable is large, such as an open-circuit or a short-circuit termination. However, the TDR method may miss small reflections from a mis-matched termination, especially when the reflections are masked by noise, such a receiver noise, cross-talk on the cable, quantization noise from an analog to digital converter (ADC), and the like.

SUMMARY

A cable tester (CT) that has an adjustable symbol clock rate can test the transmission characteristics of cables coupled to the CT over longer distances than a CT that operates at a fixed data symbol clock rate. For example, the CT may inject a test signal or training signal into a cable that conducts the signal to a remote terminal that is approximately 400 meters away from the CT. The training signal may be synchronous with a sub-symbol clock rate that is a fraction of the data symbol clock rate. The CT may be included in a physical layer device (PHY) that tests cable characteristics using a digital signal processing (DSP) method.

In DSP methods, such as the IEEE standard DSP methods for 100 Base-T (100 Mbps) and 1000 Base-T (1 Gbps) operation, respectively, the CT can sample the echo or reflected signal that is present on the cable and adaptively filter the sampled signal. The adaptive filter coefficients can quantify how much echo comes back from the cable and can associate a time delay with each portion of the echo signal. The DSP method can determine if there is an impedance discontinuity along the cable or at the end of the cable. The DSP method can also determine the type of impedance mismatch, such as an open-circuit, a short-circuit, a slight resistive, inductive, or capacitive mismatch, and the like. The DSP method can determine the cable length and other cable characteristics from even small amounts of reflection from the cable.

One type of DSP method can use a co-operative remote terminal or link partner. For example, a master-slave DSP method can use an adaptive filter to characterize a cable that carries a 1000 Base-T gigabit link signal. In this case, the CT can analyze the adaptive filter tap coefficients to determine the cable length and other cable characteristics. The co-operative the DSP method can also determine cable attenuation versus frequency, cross-talk versus frequency, and other cable characteristics.

A non-cooperative or slave-silent mode DSP method may also be used to characterize the cable. For example, in a standard IEEE 1000 Base-T operational mode, the PHY can become the master and the remote terminal can become a slave that does not generate a signal and inject the signal onto the far end of the cable. An un-powered remote terminal may also be treated as a slave. During the slave-silent mode of cable characterization, the master can inject a training signal that follows a known training pattern or training sequence into the cable. The training sequence may be a spectrally spread signal, a pseudo noise (PN) sequence, and the like. Once the training or cable characterization is complete, the master can establish a communications link at a normal or standard data symbol rate over the characterized cable.

The slave-silent mode can apply to situations in which the PHY either has no link partner or when the link partner is powered down, such as an Internet protocol (IP) phone or IP camera, and the like that receives power from a remote switch. In some case, a PHY can couple to a remote terminal that is more than 100 meters distant.

A CT, such as a CT built into a PHY can decrease the data symbol clock rate to a sub-symbol rate during an adaptive filter training sequence then analyze the DSP tap coefficients to characterize the cable. The tap spacing or time delay difference in a digital delay line within the adaptive filter can increase when the symbol clock rate decreases. For example, in a 1000 Base-T PHY, each tap coefficient can correspond to a sample spacing of eight nanoseconds (ns). In this case, increasing the training symbol clock period by a factor of two can double the sample and tap coefficient spacing to 16 ns. In this example, the cable length can be resolved to 16 ns divided by the signal group velocity on the cable. When the number of adaptive filter tap coefficients is held constant, adjusting the symbol clock rate to a sub-symbol rate during the training sequence can increase the length over which the cable can be characterized in inverse proportion to the amount of symbol rate adjustment. In other words, using the sub-symbol rate training sequence, the number of tap coefficients may remain at the number used at the standard data symbol rate.

The non-cooperative DSP method can apply to loop-back signals as well as reflected signals. For example, a remote terminal that includes a relay can connect the injected signal on one pair of conductors onto a second pair of conductors that return the signal to the PHY. The relay may be set to a state or position that provides a round-trip connection or loop-back signal to the PHY when the remote terminal is powered down. The DSP method can treat the loop-back signal as a large reflected signal, adaptively filter the reflected signal, extract a round-trip delay from the adaptive filter coefficients, and determine the cable length and other cable characteristics. In this case, the PHY can act as a master and the un-powered remote device can act as a slave-silent device. The adaptive filter tap coefficient spacing can increase in inverse proportion to the decrease in the symbol rate clock used during the cable characterization training sequence.

Aspects of the present disclosure provide for a cable tester that can test a cable to determine the cable length. The cable tester can include a clock generator that generates a clock that has clock period that is a multiple of the data symbol period and a signal generator that injects the training signal, which can be synchronous with the clock, into the cable. The cable tester can also include a receiver that samples the returned signal from the cable and adaptively filters the returned signal based on the training signal and a controller that determines the cable length from the adaptive filter tap coefficients.

Aspects of the present disclosure can provide for a method for characterizing a cable delay. The method can include generating a clock that has a training clock period that is a multiple of a data symbol period, injecting a training signal that is synchronous with the clock into the cable, sampling the returned signal from the cable, filtering the returned signal with an adaptive filter having multiple tap coefficients, and calculating the cable delay based on the tap coefficients.

BRIEF DESCRIPTION OF THE DRAWINGS

The disclosure will refer to the accompanying figures, wherein like numerals represent like elements, and wherein:

FIG. 2A shows an example of a set of tap coefficients;

FIG. 2B shows an example of a set of tap coefficients;

FIG. 2C shows an example of a set of tap coefficients;

FIG. 2D shows an example of a set of tap coefficients;

DETAILED DESCRIPTION OF EMBODIMENTS

Figure 1:
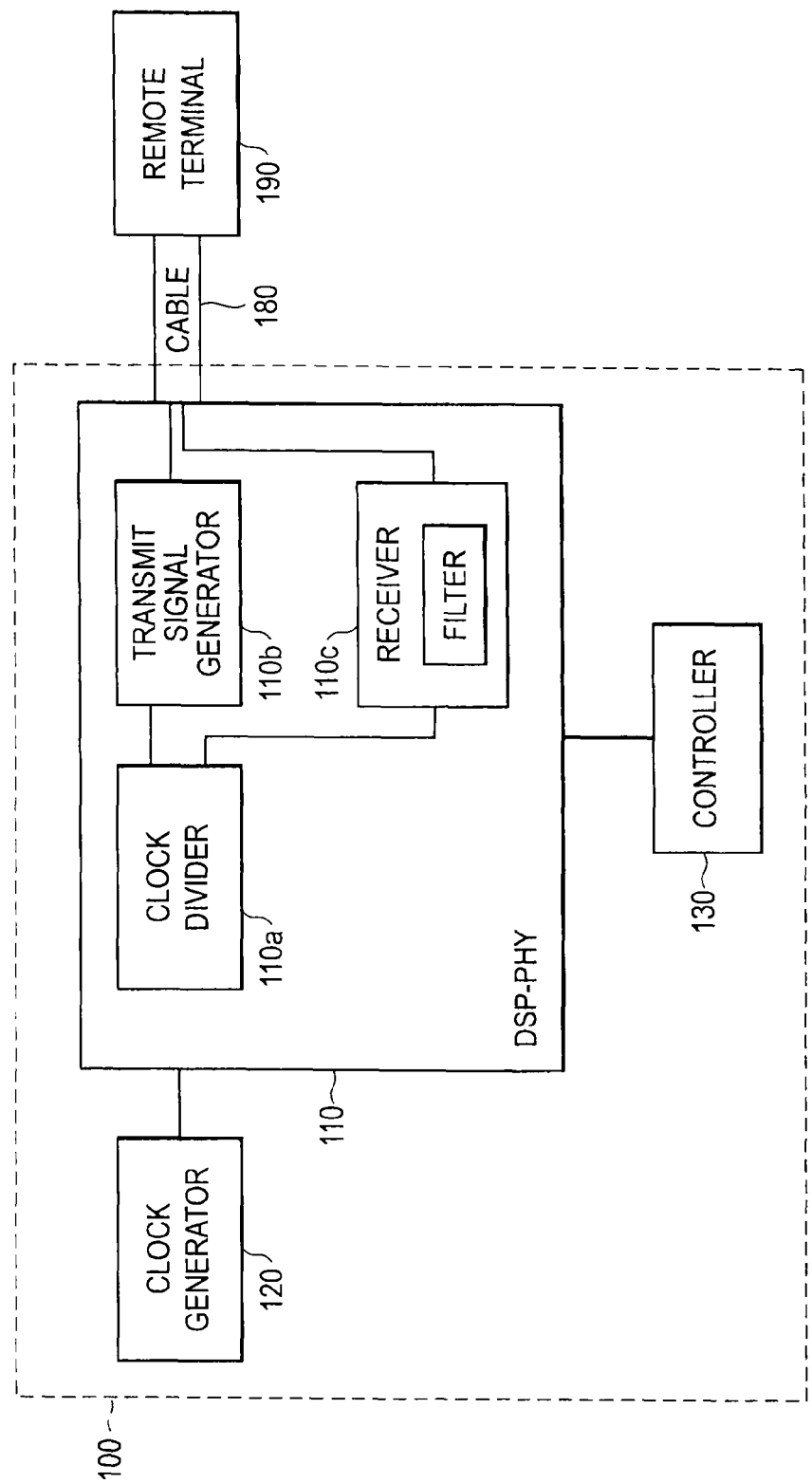
FIG. 1 shows an example of a digital signal processing (DSP) physical layer device (PHY)

FIG. 1 shows an example of a cable tester 100 that can include a DSP-PHY 110, a clock generator 120, and a controller 130. The DSP-PHY 110 can receive a master clock signal from the clock generator 120 and configuration and control signals from the controller 130. The DSP-PHY 110 can transmit a signal over a cable 180 to a termination or a remote terminal 190. The cable 180 may include multiple conductors, such as multiple conductor pairs that conduct the injected or transmitted signal to the remote terminal 190, conduct reflected signals or loop-back signals from the remote terminal 190, provide power to the remote terminal 190, and the like.

A portion of the injected signal can return to the DSP-PHY 110 after reflection from the remote terminal 190 or a portion of the cable 180. The returned signals can be reflected versions of the rejected signal from the same conductor(s) or loop-back signals that are returned to the DSP-PHY 110 via a different set of conductors. For example, an un-powered remote terminal 190 can return a loop-back signal to the DSP-PHY 110 using a relay set to a default position.

The DSP-PHY 110 can include a clock divider 110$a$, a signal generator 110$b$, and a receiver 110$c$. The clock divider 110$a$ can divide a master or data symbol clock signal from the clock generator 120 by a programmed clock divisor, such as one, two or more to generate a training clock that has a clock period that is a multiple of the data symbol clock period. Division by one can correspond to a normal or data symbol clock rate that the cable tester 100 uses once training is complete. Division by greater than one, for example, can correspond to a training mode that characterizes the cable 180 over a length of more than 100 meters. As another example, the clock divider 110$a$ can receive a division factor from the controller 130 that halves the master or data symbol clock. As an example, for a 100 Base-T signal, the clock generator 120 can generate a 25 MHz master clock signal that the clock divider 110$a$ divides to generate a 12.5 MHz divided clock signal. The 12.5 MHz divided clock signal can synchronize both the receiver 110$c$ and the signal generator 110$b$.

The signal generator 110$b$ can use the divided clock to determine an training clock rate or sub-symbol clock rate at which training signals may be transmitted over the cable 180. Both the training signals and digital signals that are transmitted at the data symbol rate may be line-coded, modulated, scrambled, spectrally-spread, and the like. For example, the signal generator 110$b$ can transmit a non return to zero (NRZ) bit stream, an M-ary multilevel signal, a quadrature amplitude modulation (QAM), a quadrature amplitude shift key (QASK), a differential phase shift key (DPSK), a pulse-position modulation (PPM) signal, and the like over the cable 180.

The receiver 110$c$ can measure injected, outgoing signal from the signal generator 110$b$ and the reflected or loop-back signals from the cable 180. For example, the receiver 110$c$ can measure near-end reflections, far-end reflections, and other reflections of intermediate distance along the length of the cable 180 as discussed with respect to FIG. 2.

The receiver 110$c$ can sample and adaptively filter the return signals from the cable. For example, the receiver 110$c$ can sample the returned signal with an analog to digital converter (ADC) and adaptively filter the returned signal using a 13 tap or a 256-tap adaptive filter that processes samples of the returned signal in synchrony with the sub-symbol clock. In other words, during training, the receiver 110$c$ can process the return signal in synchrony with a known training sequence on the injected signal. The known training sequence may assist the adaptive filtering process when used in a decision-directed adaptive filter or in other forms of adaptive filter.

The controller 130 can configure the internal divider 110$a$, the transmission generator 110$b$, and the receiver 110$c$ and can estimate or determine the cable round-trip delay and cable length by analysing the tap coefficients in the receiver 110c. For example, the controller 130 can download a training sequence into the transmission generator 110b that causes a pseudo-random training signal to be injected into the cable. The training sequence and the adjusted or sub-symbol clock rate can modify a condition number, such as a ratio of a maximum to a minimum eigenvalue of the channel matrix for the round-trip channel from the PHY and back, so that an adaptive filter can resolve an impedance discontinuity that determines cable length. In other words, the controller 130 can generate a training signal at a symbol rate that increases the inter-tap delay spacing and conditions the round-trip channel matrix for inversion by adaptive digital signal processing techniques. It may be appreciated that digital signal processing (DSP) adaptive filters, such as the least mean square (LMS) algorithm, the Kalman algorithm, recursive least squares filters, lattice filters, and the like, can identify the characteristics of the channel such that, for example, a propagation delay to an impedance discontinuity or a cable length can be determined.

FIG. 2A shows an example of a set of tap coefficients 210 for a 13-tap adaptive filter that processes a return signal at a data symbol clock rate that has a period of 25 microseconds. The fourth tap 210a can correspond to a delay associated with a round trip cable length of 100 meters or a cable length of 50 meters.

FIG. 2B shows an example of a set of tap coefficients 220 for a 13-tap adaptive filter that processes a return signal at a symbol clock rate that is one-half of the data symbol clock. The tap coefficients 220 can peak at the second tap coefficient 220a corresponding to a delay associated with the same cable length of 50 meters using a sub-symbol rate clock that is half of the data symbol clock. In other words, the second tap 220a can correspond to a primary reflection that is resolved by an adaptive filter with double the tap spacing or delay. The cable delay can be determined by selecting a peak tap coefficient and multiplying the tap index by the sub-symbol rate clock period.

FIG. 2C shows an example of a set of tap coefficients 230 for a 13-tap adaptive filter that processes a return signal at the data symbol clock rate. The seventh tap 230a can correspond to a delay associated with a cable length of 112.5 meters.

FIG. 2D shows an example of a set of tap coefficients 240 for a 13-tap adaptive filter that processes a return signal at a symbol clock rate that is one-half of the data symbol clock rate. The tap coefficients 240 can peak between the third and fourth numbered tap coefficient 240a corresponding to an interpolated delay associated with the same cable length of 112.5 meters using a sub-symbol rate clock that is half of the data symbol clock. The interpolated delay can correspond to a centroid of a returned signal. The centroid can be determined by parabolic interpolation, differentiating a phase unwrapped phase response from a Fourier transform of the tap coefficients to determine a group delay, and the like. In other words, the second tap 220a can correspond to a primary reflection that is resolved by an adaptive filter with double the tap spacing or delay.

Figure 3:
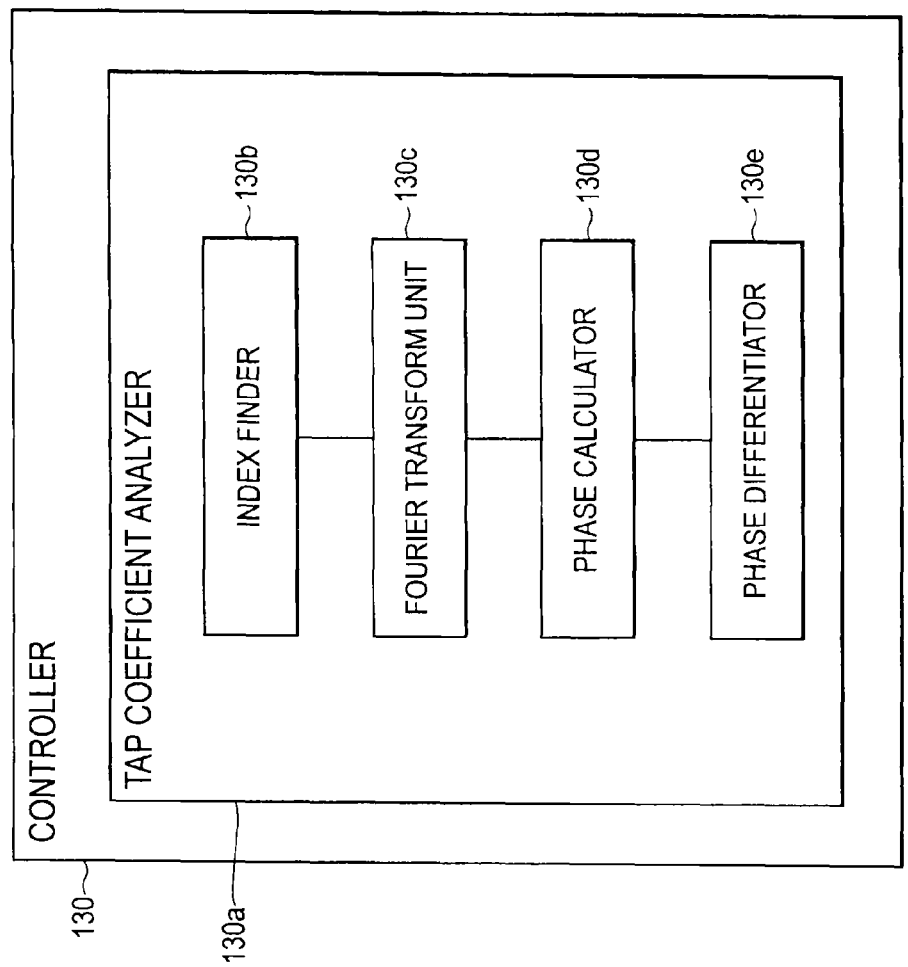
FIG. 3 shows an example of the controller.

FIG. 3 shows an example of the controller 130 in an embodiment. The controller 130 can include a tap coefficient analyzer 130a. The tap coefficient analyzer 130a can include a Fourier transform unit 130c, a phase calculator 130d, and a phase differentiator 130e. The controller 130 can extract tap coefficients from the adaptive filter 120a in the receiver 110c and can Fourier transform the tap coefficients to determine an inphase and quadrature response of the tap coefficients. The Fourier transform unit 130c can couple the inphase and quadrature responses to the phase calculator 130d.

The phase calculator 130d can determine a phase response from the inphase and quadrature responses. For example, the phase calculator 130d can determine the radian phase of each of the frequency components of a 256-point Fourier transform. The phase calculator 130d can couple the phase response to the phase differentiator 130e, which can determine a group delay that corresponds to a cable round-trip delay by differentiating the phase response with respect to radian frequency. The phase differentiator may weight the differentiated phase response by the Fourier transform magnitude response or other weighting factors so that the estimated group delay corresponds to a centroid or averaged cable delay estimate. It may be noted that, with respect to the phase calculator 130d, the modulo-$2\pi$ phase estimate may be unwrapped before phase differentiation by the phase differentiator 130e.

Figure 4:
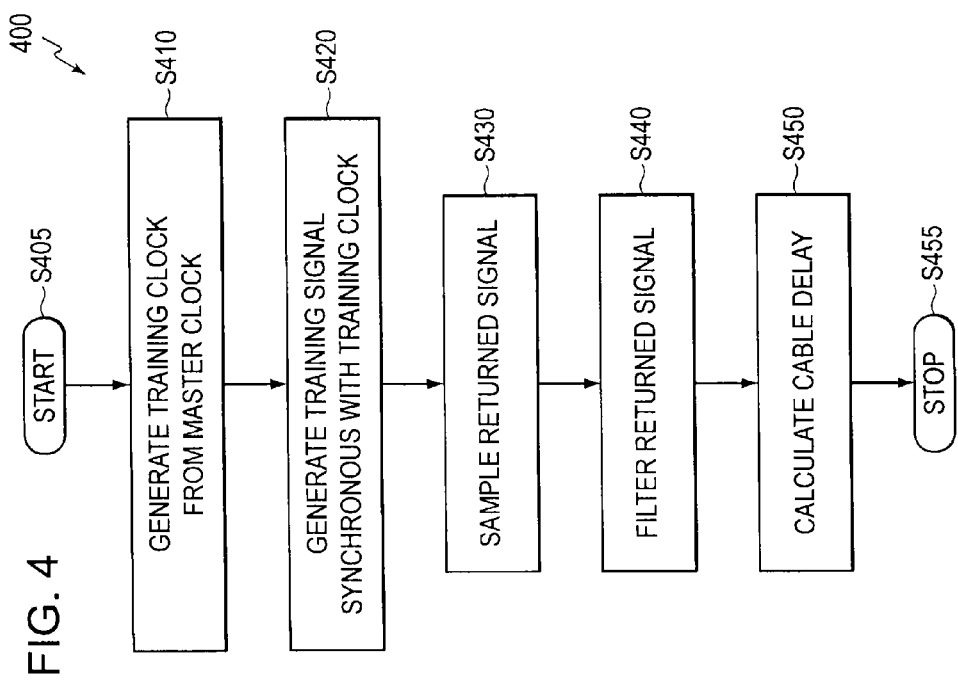
FIG. 4 shows an example of a program flowchart.

FIG. 4 shows an example of a program flowchart 400 according to an embodiment. The program can begin at a program step S405 and can proceed to program step S410 in which the program can generate a training clock signal from a master clock signal. For example, the program can divide a master clock signal by two to generate a half rate or sub-symbol rate clock having a period that is twice the master clock.

From program step S410, the program can flow to program step S420 in which the program can generate a training signal that is synchronous with the training clock. For example, a training clock that operates at half the data symbol clock rate or 62.5 MHz may be synchronous with a training signal that has training symbols that are transmitted with a 16 nanosecond (ns) and is injected into the cable.

From program step S420, the program flow can proceed to program step S430 in which the return signal from the cable is sampled. For example, the receiver 110c can sample the return signal using a 16 ns sampling period. The sampling process can convert the return signal from an analog signal to a digital signal using, for example, an eight-bit analog-to-digital converter (ADC). From program step S430, the program flow can proceed to program step S440 in which the program can filter the returned signal. For example, the program can adaptively filter the return signal so that a set of adaptive filter coefficients characterizes the cable. The adaptive filter coefficients can, for example, exhibit a peak magnitude, such as the peak magnitude shown with respect to FIG. 2A and denoted by the time or index 210a. Filtering the return signal in program step S440 can include, for example, using a least-mean square (LMS) algorithm, a Kalman filter, a lattice filter, a decision-directed adaptive filter, and the like.

From program step S440, the program flow can proceed to program step S450 in which the program can calculate the cable delay based on tap coefficients. For example, the program can use the index of a tap coefficient having a peak magnitude and determine the cable delay by multiplying the index by the adaptive filter tap coefficient delay spacing. From program step S450, the program flow can proceed to program step S455, where the program can stop.

Figure 5:
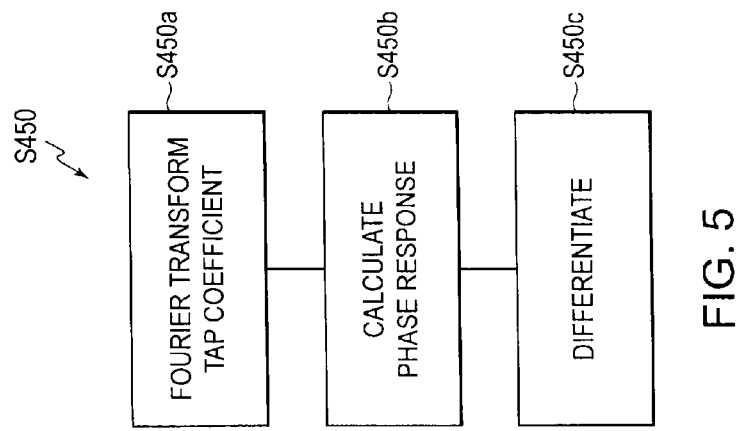
FIG. 5 shows an embodiment of a program step for calculating the cable delay.

FIG. 5 shows an embodiment of a program step for calculating the cable delay S450 in which the program can calculate a cable delay from a Fourier analysis of the tap coefficients. The program step S450 can include a program step S450a in which the program can Fourier transform the tap coefficients. For example, the program can Fourier transform a 256-tap coefficient set using a 256-point fast Fourier transfer (FFT). From program step S450a, the program can proceed to program step S450b in which the program can calculate the phase response of the tap coefficients. For example, the program can calculate a four-quadrant arctangent and can unwrap the phase response to remove modulo-2π discontinuities. From program step S450b, the program can proceed to program step S450c in which the program can differentiate the phase response as a function of radian frequency. For example, the program can apply a smoothing or low pass differentiation function to determine a group delay estimate at a centroid frequency of the training signal.

While the invention has been described in conjunction with the specific exemplary embodiments thereof, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A tester for a cable, the tester comprising:
   a transmit signal generator configured to transmit, in synchrony with a clock having a predetermined period, a first signal onto the cable;
   a receiver including (i) an analog to digital converter (ADC), and (ii) a filter having a plurality of tap coefficients; and
   a controller configured to determine a length of the cable or a length to a discontinuity in the cable, wherein the length of the cable or the length to the discontinuity in the cable is determined based at least in part on (i) a particular tap index at which a peak occurs among the plurality of tap coefficients of the filter, and (ii) the predetermined period of the clock, the controller further configured to transform the tap coefficients to a frequency domain by a Fourier transform unit, determine a phase response based on the transformed tap coefficients, and determine a round-trip delay from a differentiation of the phase response with respect to a radian frequency.

2. The tester of claim 1, wherein the length of the cable or the length to the discontinuity in the cable is determined based on multiplying the particular tap index at which the peak occurs by the predetermined period of the clock.

3. The tester of claim 1, further comprising:
   a clock generator configured to generate a clock signal having a data symbol period, the training signal being synchronous with the clock signal; and
   a clock divider configured to divide the data symbol period to generate the training signal having an adjustable clock period that is a multiple of the data symbol period.

4. The tester of claim 3, wherein the multiple is greater than unity.

5. The tester of claim 1, wherein the controller further comprises a tap coefficient analyzer configured to calculate the round-trip delay from the tap coefficients.

6. The tester of claim 5, wherein the tap coefficient analyzer determines at least one of an index of the highest tap coefficient and a group delay that is based on a tap coefficient phase response.

7. The tester of claim 1, wherein the controller is further configured to download a training sequence that includes a plurality of pseudo-random training symbols to a signal generator configured to inject the training signal into the cable.

8. The tester of claim 1, wherein the controller is further configured to determine a cable frequency response.

9. The tester of claim 1, wherein the signal returned is at least one of a reflected signal and a loop-back signal.

10. The tester of claim 1, wherein the analog to digital converter (ADC) is configured to generate samples of a second signal returned from the cable, the second signal being returned from the cable responsive to the first signal having been transmitted onto the cable, and the filter is configured to filter, in synchrony with the clock having the predetermined period, the samples of the second signal returned from the cable, wherein in filtering the samples of the second signal returned from the cable, the plurality of tap coefficients of the filter includes the peak at the particular tap index.

11. A method for characterizing a delay of a cable, comprising:
    transmitting, in synchrony with a clock having a predetermined period, a first signal onto the cable;
    generating samples of a second signal returned from the cable;
    filtering, by a filter, the samples of the second signal returned from the cable;
    determining a length of the cable or a length to a discontinuity in the cable, wherein the length of the cable or the length to the discontinuity in the cable is determined based at least in part on (i) a particular tap index at which the peak occurs among a plurality of tap coefficients of the filter, and (ii) the predetermined period of the clock;
    transforming the tap coefficients to a frequency domain by a Fourier transform unit;
    determining a phase response based on the transformed tap coefficients; and
    determining a round-trip delay from a differentiation of the phase response with respect to a radian frequency.

12. The method of claim 11, wherein the length of the cable or the length to the discontinuity in the cable is determined based on multiplying the particular tap index at which the peak occurs by the predetermined period of the clock.

13. The method of claim 11, further comprising:
    generating a clock signal having a data symbol period, the training signal being synchronous with the clock signal; and
    dividing the data symbol period to generate the training signal having an adjustable clock period that is a multiple of the data symbol period.

14. The method of claim 13, wherein the multiple is greater than unity.

15. The method of claim 11, further comprising:
    calculating the round-trip delay from the tap coefficients.

16. The method of claim 15, further comprising:
    determining at least one of an index of the highest tap coefficient and a group delay that is based on a tap coefficient phase response.

17. The method of claim 11, further comprising:
    downloading a training sequence that includes a plurality of pseudo-random training symbols; and
    injecting the training signal including the downloaded training sequence into the cable.

18. The method of claim 11, further comprising:
    determining a cable frequency response.

19. The method of claim 11, wherein filtering the signal returned filters the signal returned that is at least one of a reflected signal and a loop-back signal.

20. The method of claim 11, wherein the second signal is returned from the cable responsive to the first signal having been transmitted onto the cable, the filtering is in synchrony with the clock having the predetermined period, and the plurality of tap coefficients of the filter includes the peak at the particular tap index.

* * * * *